United States Patent [15] 3,686,580

Van Den Plassche [45] Aug. 22, 1972

[54] CURRENT AMPLIFIER

[72] Inventor: Rudy Johan Van Den Plassche, Emmasingel, Eindhoven, Netherlands

[73] Assignee: U.S. Phillips Corporation, New York, N.Y.

[22] Filed: Sept. 17, 1970

[21] Appl. No.: 72,918

[30] Foreign Application Priority Data

Sept. 26, 1969 Netherlands..............6914695

[52] U.S. Cl. ........................330/18, 330/22, 330/24, 330/25, 330/32

[51] Int. Cl. ..............................................H03f 3/42

[58] Field of Search..........330/13, 17, 18, 22, 25, 24, 330/32

[56] References Cited

UNITED STATES PATENTS

| | | | |
|---|---|---|---|
| 3,500,218 | 3/1970 | Burwen | 330/13 X |
| 3,526,845 | 9/1970 | Sikorra | 330/13 X |
| 3,487,320 | 12/1969 | Heidecker et al. | 330/13 |

*Primary Examiner*—Roy Lake
*Assistant Examiner*—James B. Mullins
*Attorney*—Frank R. Trifari

[57] ABSTRACT

A current amplifier comprising first and second series circuits coupled to the emitter and base respectively of a first transistor amplifying received signals to allow accurate adjustment of the current in the first series circuit relative to the current in the second series circuit without increasing the output impedance of the amplifier. The first series circuit comprises a first diode and a second transistor coupling the emitter of the first transistor to the power supply. The second series circuit comprises a second diode, a third transistor, and a current determining means coupling the base of the first transistor to the power supply. The first and second series circuits cooperate to respond to differences in the current between the current in the second series circuit and the current in the first series circuit thereby maintaining predetermined relationships between these currents.

4 Claims, 3 Drawing Figures

Figure 1:
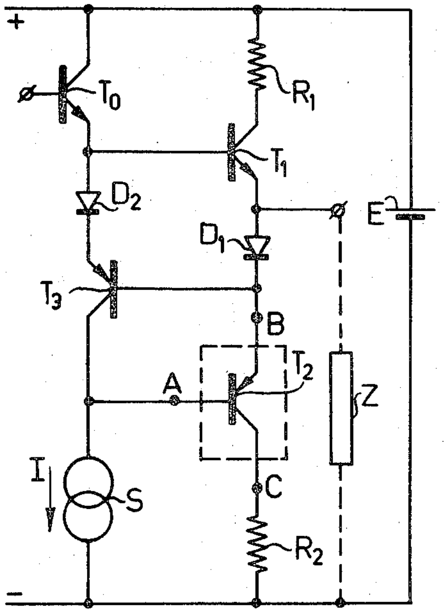

INVENTOR.
RUDY J. VAN DEN PLASSCHE
BY
Frank R. Trifari
AGENT.

CURRENT AMPLIFIER

The invention relates to a current amplifier in which the signal current is supplied to the base of first transistor from the emitter of which the amplified signal is taken. In a known current amplifier of this type the emitter of the first transistor of the npn type is connected to a supply terminal through the emitter collector path of a second transistor of the pnp type. The base of the first transistor is connected to the same supply terminal through the series combination of two diodes and a current supply source. The base of the second transistor is connected to the terminal of the said current supply source not connected to the supply terminal. In this known current amplifier the quiescent current of the first and second transistors is adjusted by means of the two diodes and the current supply source. The two diodes are traversed by a constant current so that a voltage $V_o$ will be set up across them. Consequently, this voltage is set up between the base of the first transistor and the base of the second transistor. As a result, a current will flow through the first and second transistors which is substantially equal to the constant flowing through the two diodes. If now the voltage $V_o$ varies, for example owing to a variation in temperature, the current flowing though the first and second transistors will remain constant, because the current flowing through the diodes is constant also.

The known current amplifier has the disadvantage that the current flowing though the first and second transistors never can be made exactly equal to the current flowing through the two diodes. This is due to the "early effect" which occurs in transistors. This is due to the fact that the current flowing through a transistor is determined not only by the base emitter voltage of the transistor but also by its collector emitter voltage. The two diodes of the afore-described current amplifier may be regarded as two transistors in each of which the base is directly connected to the collector. This means that the collector emitter voltages of these transistors connected as diodes are equal to zero volt. However, the collector emitter voltage of the first and of the second transistor is equal to one half of the supply voltage applied between the collectors of the first and second transistors. Consequently, the quiescent current flowing through the first and second transistors will be greater than the current flowing through the two diodes, the difference increasing with increase in the applied supply voltage. The afore-described early effect occurs very strongly in horizontal pnp transistors, so that in the known current amplifier the quiescent current may be considerably different from the current through the two diodes. To compensate for this current inequality frequently small resistors are included in the emitter leads of the first and second transistors. A first disadvantage of this arrangement consists in that the output impedance of the current amplifier is increased, and a second disadvantage is that, in driving, the voltage drop across the two resistors alternately cuts off the first and the second transistor, which gives rise to linearity problems at the passages through zero of the amplified signal.

It is an object of the present invention to obviate the said difficulties, and the current amplifier according to the invention is characterized in that the emitter of the first transistor is connected to a supply terminal through the series connection of at least one additional diode and the emitter collector path of a second transistor and the base of the first transistor is connected to the same supply terminal through the series connection of at least one second diode, the emitter collector path of a third transistor and a current-determining element, the base of the third transistor being connected to the lead connecting the first diode to the emitter of the second transistor, and the base of the second transistor being connected to the lead connecting the third transistor to the current-determining element.

Figure 3:
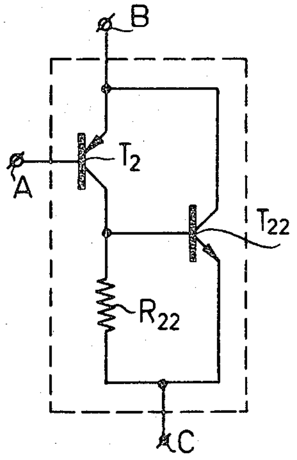
Figure 2:
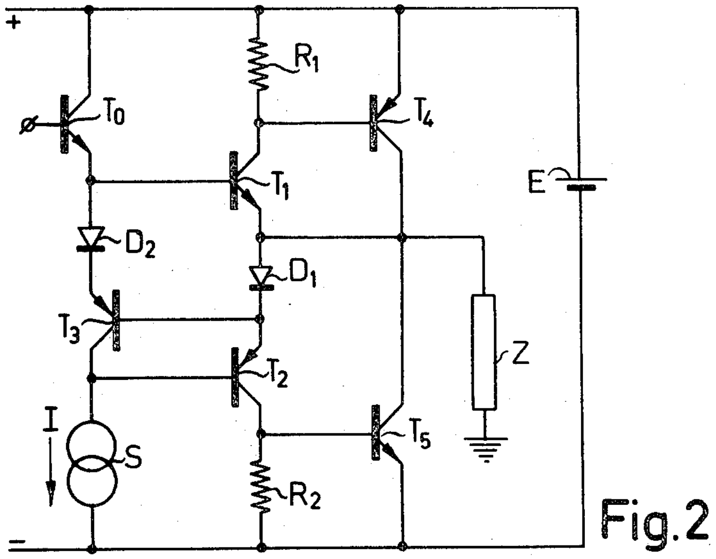

Embodiments of the invention will now be described, by way of example, with reference to the accompanying diagrammatic drawing, in which:

FIG. 1 is the circuit diagram of a current amplifier according to the invention, FIG. 2 shows another embodiment of the current amplifier according to the invention and, FIG. 3 shows a quasi pnp transistor.

Referring now to FIG. 1, the collector of a first transistor $T_1$ is connected to the positive terminal of a voltage supply source E through a resistor 1. The emitter of the transistor $T_1$ is connected through the series combination of a first diode $D_1$, the emitter collector path of a second transistor $T_2$ and a resistor $R_2$ to the negative terminal of the voltage supply source E. The base of the transistor $T_2$ is connected to the negative terminal of the voltage supply source E through a current-determining element S. The current-determining element may be a resistor or a current source. The base of the transistor $T_1$ is connected to the base of the transistor $T_2$ through a second diode $D_2$ and the emitter collector path of the third transistor $T_3$. The base of the transistor $T_3$ is connected to the emitter of the transistor $T_2$. The base of the transistor $T_1$ is connected to the emitter of a transistor $T_0$ connected as an emitter follower. The signal to be amplified may be applied to the base of the transistor $T_0$. The amplified signal may be derived from the emitter of the transistor $T_1$, for example across the impedance Z, as is shown in this Figure by broken lines.

The operation of the current amplifier according to the invention is as follows. The transistors $T_1$, $T_2$ and $T_3$ and the diodes $D_1$ and $D_2$ form a controlled current source. The measuring diode of this current source is formed by the series combination of the diode $D_1$ and the base emitter path of the transistor $T_1$. The voltage across this measuring diode is equal to the sum of the voltages across the diode $D_2$ and the base emitter path of the transistor $T_3$ under any circumstances. The quiescent current flowing through the measuring diode is compared with the current flowing though the current-determining element S. If now the quiescent current though the measuring diode and hence the Quiescent current through the two transistors $T_1$ and $T_2$ differs from the current flowing through the current-determining element S, the quiescent current is reduced through the collector of the transistor $T_3$ to the base of the transistor $T_2$ until the quiescent current through the transistors $T_1$ and $T_2$ has again become equal to the current flowing through the current-determining element S. Although the sum of the voltages across the diode $D_1$ and across the base emitter diode of the transistor $T_1$ will be constant, the current flowing through the diode $D_1$ may considerably differ from the current through the transistor $T_1$, i.e. when an output impedance Z is connected between the emitter of the transistor $T_1$ and a point of constant potential, as is shown in broken lines in FIG. 1. The current through the transistor $T_1$ will increase with increase in the output voltage at the emitter of the transistor $T_1$. Hence, the base emitter voltage of the transistor $T_1$ increases. Because the sum of the voltages across the diode $D_1$ and across the base emitter path of the transistor $T_1$ is constant, the voltage across the diode $D_1$ will decrease by the same amount by which the voltage across the base emitter diode of the transistor $T_1$ increases. This means that when the current through the transistor $T_1$ has become equal to $j.I$, the current through the diode $D_1$ will be equal to $I/j$, where I is the current flowing through the current-determining element. If the output signal at the emitter of the transistor $T_1$ decreases, the reversed effect will occur. However, the current through the transistor $T_1$ will now decrease with increase of the current through the diode $D_1$. The maximum output current which can flow through the load Z is equal to the current I multiplied by the base collector current amplification factor $\beta$ of the transistor $T_2$.

The fact that the base emitter voltage of the transistor $T_2$ is not one of the factors determining the adjustment of the quiescent current through the transistors $T_1$ and $T_2$ has the advantage that the transistor $T_2$ may simply be replaced by a quasi pnp transistor as shown in FIG. 3. For this purpose, in the circuit arrangement shown in FIG. 1 the transistor $T_2$ is omitted and terminals A, B and C of the quasi pnp transistor shown in FIG. 3 are connected to corresponding points A, B and C of the circuit arrangement of FIG. 1. The inclusion of the quasi pnp transistor in the circuit arrangement of FIG. 1 provides the advantage that the maximum output current of the current amplifier is increased. This current will now be equal to $\beta$.I amperes, where $\beta$ is the base collector current amplification factor of an npn transistor $T_{22}$ of FIG. 3. The current amplification factor $\beta$ of the transistor $T_{22}$ is much greater than the corresponding current amplification factor of the pnp transistor $T_2$ of FIG. 1. This replacement is not possible in the known current amplifier described at the beginning of this specification.

Owing to the absence of the resistors in the emitter leads of the transistors $T_1$ and $T_2$ the output impedance of the current amplifier shown in FIG. 1 will be several times smaller than the output impedance of the known current amplifier. In addition, the absence of the said resistors results in that neither the transistor $T_1$ nor the transistor $T_2$ will ever be cut off by driving, because the current through the transistors $T_1$ or $T_2$ logarithmically tends to zero. As a result, compared with the known current amplifier much smaller quiescent currents through the transistors $T_1$ and $T_2$ are permissible and moreover far less linearity problems will arise at the passages through zero of the amplified signal.

So far it has been assumed that the quiescent current through the transistors $T_1$ and $T_2$ will always have to be equal to the current I flowing through the current-determining element S. Under certain circumstances, for example in respect of bandwidth, stability and current consumption, it may be of advantage to make the quiescent current different from the current I flowing through the current-determining element S. For this purpose, for example, the emitter area of the transistor $T_3$ may be made larger than the emitter area of the diode $D_2$, and the emitter area of the diode $D_1$ may be made larger than the emitter area of the transistor $T_1$, the quotient of the areas of the diode $D_2$ and of the transistor $T_1$ remaining equal to the quotient of the areas of the transistor $T_3$ and of the diode $D_1$.

The resistors $R_1$ and $R_2$ may be made equal to zero. This has the advantage that the driving range of the current amplifier will be a maximum.

If the out put current is too small, the circuit arrangement of FIG. 1 may simply be expanded, as is shown in FIG. 2. The base of a transistor $T_4$ is connected to the collector of the transistor $T_1$ and the emitter of the transistor $T_4$ is connected to the positive terminal of the voltage supply source E. The base of a transistor $T_5$ is connected to the collector of the transistor $T_2$ and the emitter of the transistor $T_5$ is connected to the negative terminal of the voltage supply source E. The collectors of the transistors $T_4$ and $T_5$ are connected to the emitter of the transistor $T_1$, which emitter is also connected to a point of constant potential through the output impedance Z. The resistors $R_1$ and $R_2$ have been chosen so that for small input signals appearing at the base of the transistor $T_0$ the two transistors $T_4$ and $T_5$ remain cut off. When input signal increases the two transistors $T_4$ and $T_5$ will be rendered conductive at a certain instant, because the voltages produced across the resistors $R_1$ and $R_2$ have become sufficiently large. At the said instant the total output current is equal to the sum of the currents through the transistors $T_1$ and $T_4$ or to the sum of the currents through the transistors $T_2$ and $T_5$. The addition of the currents ensures that the frequency properties of the transistors $T_4$ and $T_5$ play no part in determining the transfer characteristic between the input and the output of the current amplifier.

What is claimed is:

1. A current amplifier comprising signal input and output means, a first transistor for amplifying received signals having its base coupled to said signal input means and its emitter coupled to said signal output means, input means for a power supply, the collector of said first transistor being connected to a first terminal of said power supply input means, a first series circuit coupling the emitter of said first transistor to a second terminal of said power supply input means, said first series circuit comprising a first diode and the emitter-collector path of a second transistor, a second series circuit coupling the base of said first transistor to said second terminal of said power supply, said second series circuit comprising a second diode, the emitter-collector path of a third transistor and current determining means, the base of said third transistor being connected to the junction between said first diode and said second transistor and the base of said second transistor being connected to the junction between said third transistor and said current determining means, said first and second series circuits providing means for measuring and adjusting the current in said first series circuit in response to deviations thereof to maintain predetermined current relationships with the current in said second series circuit.

2. A current amplifier as claimed in claim 1 further comprising a resistor coupling the collector of said second transistor to said second terminal of said power supply input means, and a fourth transistor of the type having a larger base to emitter amplification factor than that of said second transistor for cooperating with said second transistor to increase the output current of said current amplifier, the collector of said fourth transistor being connected to the emitter of said second transistor, the base of said fourth transistor being connected to the collector of said second transistor, and the emitter of said fourth transistor being connected to said second terminal of said power supply input means.

3. A current amplifier as claimed in claim 1 wherein resistors are arranged between the collectors of the first and second transistors and the terminals of said power supply input means.

4. A current amplifier as claimed in claim 3 wherein said resistors are each shunted by the base emitter path of a transistor having its collector connected to the emitter of said first transistor.

* * * * *